(12) United States Patent
Pedersen et al.

(10) Patent No.: US 7,288,179 B2
(45) Date of Patent: Oct. 30, 2007

(54) METHOD FOR PROVIDING ELECTRICAL AND FLUID COMMUNICATION TO A ROTATING MICROELECTRONIC WORKPIECE DURING ELECTROCHEMICAL PROCESSING

(75) Inventors: John M. Pedersen, Kalispell, MT (US); James J. Erickson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 551 days.

(21) Appl. No.: 10/745,030

(22) Filed: Dec. 23, 2003

(65) Prior Publication Data

US 2004/0134787 A1 Jul. 15, 2004

Related U.S. Application Data

(60) Division of application No. 09/797,504, filed on Mar. 1, 2001, now Pat. No. 6,673,216, which is a continuation-in-part of application No. 09/386,803, filed on Aug. 31, 1999, now Pat. No. 6,309,520.

(51) Int. Cl.
*C25D 5/04* (2006.01)
*C25D 5/06* (2006.01)
(52) U.S. Cl. .................. 205/123; 205/133; 205/143
(58) Field of Classification Search ............. 205/123, 205/133, 143
See application file for complete search history.

(56) References Cited

U.S. PATENT DOCUMENTS 3,779,887 A * 12/1973 Gildone ............... 204/224 R (Continued)

FOREIGN PATENT DOCUMENTS

WO WO 99/25904 5/1999

(Continued)

OTHER PUBLICATIONS

U.S. Appl. No. 09/386,558, filed Aug. 31, 1999, Woodruff et al.

(Continued)

*Primary Examiner*—Roy King
*Assistant Examiner*—William T. Leader
(74) *Attorney, Agent, or Firm*—Perkins Coie LLP (57) ABSTRACT

A method and apparatus for transmitting electrical signals and fluids to and/or from a microelectronic workpiece. An apparatus in accordance with one embodiment of the invention includes a shaft rotatable about a shaft axis and having a first end with a first electrical contact portion toward the first end, a second end opposite the first end, and an internal channel along the shaft axis between the first and second ends. The shaft can further have at least one first hole toward the first end with the first hole extending radially from the channel to an external surface of the shaft. The shaft can still further have at least one second hole toward the second end with the second hole extending from the channel to the external surface. A housing rotatably receives the shaft and has an aperture coupleable to a fluid source and/or fluid sink. The housing further has a fluid passage positioned adjacent to at least one of the first holes of the shaft and in fluid communication with the aperture when the shaft rotates relative to the housing. The housing also has a second electrical contact portion engaged with the first electrical contact portion to transmit electrical signals between the first and second electrical contact portions while the shaft rotates relative to the housing.

35 Claims, 9 Drawing Sheets

U.S. PATENT DOCUMENTS

| | | |
|---|---|---|
| 4,137,867 A | 2/1979 | Aigo |
| 4,246,088 A | 1/1981 | Murphy et al. |
| 4,259,166 A | 3/1981 | Whitehurst |
| 4,304,641 A | 12/1981 | Grandia et al. |
| 4,341,629 A | 7/1982 | Uhlinger |
| 4,409,505 A * | 10/1983 | Petersen ............... 310/90 |
| 4,422,915 A | 12/1983 | Wielonski et al. |
| 4,466,864 A | 8/1984 | Bacon et al. |
| 4,576,685 A | 3/1986 | Goffredo et al. |
| 4,685,414 A | 8/1987 | DiRico |
| 4,743,787 A * | 5/1988 | Bunner et al. ............... 310/242 |
| 4,913,085 A | 4/1990 | Vohringer et al. |
| 5,110,159 A | 5/1992 | Heraol et al. |
| 5,135,636 A | 8/1992 | Yee et al. |
| 5,139,818 A | 8/1992 | Mance |
| 5,227,041 A | 7/1993 | Brogden et al. |
| 5,271,953 A | 12/1993 | Litteral |
| 5,310,580 A | 5/1994 | O'Sullivan et al. |
| 5,344,491 A | 9/1994 | Katou |
| 5,389,496 A | 2/1995 | Calvert et al. |
| 5,418,341 A * | 5/1995 | Sato ............... 200/11 R |
| 5,441,629 A | 8/1995 | Kosaki |
| 5,443,707 A | 8/1995 | Mori |
| 5,447,615 A | 9/1995 | Ishida |
| 5,522,975 A | 6/1996 | Andricacos et al. |
| 5,550,315 A | 8/1996 | Stormont |
| 5,597,460 A | 1/1997 | Reynolds |
| 5,609,239 A | 3/1997 | Schlecker |
| 5,670,034 A | 9/1997 | Lowery |
| 5,744,019 A | 4/1998 | Ang |
| 5,747,098 A | 5/1998 | Larson |
| 5,776,327 A | 7/1998 | Botts et al. |
| 5,788,829 A | 8/1998 | Joshi et al. |
| 5,843,296 A | 12/1998 | Greenspan |
| 5,904,827 A | 5/1999 | Reynolds |
| 5,932,077 A | 8/1999 | Reynolds |
| 5,957,836 A | 9/1999 | Johnson |
| 5,985,126 A | 11/1999 | Bleck et al. |
| 6,001,234 A | 12/1999 | Batz, Jr. et al. |
| 6,001,235 A | 12/1999 | Arken et al. |
| 6,004,828 A | 12/1999 | Hanson |
| 6,080,291 A | 6/2000 | Woodruff et al. |
| 6,136,163 A | 10/2000 | Cheung et al. |
| 6,139,712 A | 10/2000 | Patton et al. |
| 6,156,167 A | 12/2000 | Patton et al. |
| 6,231,428 B1 | 5/2001 | Maloney et al. |
| 6,248,222 B1 | 6/2001 | Wang |
| 6,309,524 B1 | 10/2001 | Woodruff et al. |
| 6,334,937 B1 | 1/2002 | Batz, Jr. et al. |
| 6,416,647 B1 | 7/2002 | Dordi et al. |
| 6,673,216 B2 | 1/2004 | Pedersen et al. |
| 2001/0000396 A1 | 4/2001 | Dordi et al. |
| 2004/0134773 A1 | 7/2004 | Pedersen et al. |

FOREIGN PATENT DOCUMENTS

| | | |
|---|---|---|
| WO | WO 99/25905 | 5/1999 |
| WO | WO 00/03072 | 1/2000 |
| WO | WO 00/32835 | 6/2000 |

OTHER PUBLICATIONS

U.S. Appl. No. 09/386,610, filed Aug. 31, 1999, Woodruff et al.

U.S. Appl. No. 09/386,197, filed Aug. 31, 1999, Woodruff et al.

PCT International Search Report for International Application No. PCT/US02/06390; mailed Aug. 8, 2002; Applicant: Semitool, Inc.; 4 pgs.

Rotating Unions Catalogue, 28 pgs, Rotary Systems Inc., Anoka, Minnesota.

Written Opinion for International Application No. PCT/US02/06390; Applicant: Semitool, Inc.; Feb. 21, 2003; 8 pgs; PCT Office, Washington DC.

* cited by examiner

METHOD FOR PROVIDING ELECTRICAL AND FLUID COMMUNICATION TO A ROTATING MICROELECTRONIC WORKPIECE DURING ELECTROCHEMICAL PROCESSING

CROSS-REFERENCE TO RELATED APPLICATIONS

This application is a divisional of U.S. patent application Ser. No. 09/797,504, filed Mar. 1, 2001 now U.S. Pat. No. 6,673,216 which is a continuation-in-part of U.S. patent application Ser. No. 09/386,803 filed Aug. 31, 1999 now U.S. Pat. No. 6,309,520, which is incoporated herein in its entirely by reference. Also incorporated by reference in its entirety is U.S. patent application Ser. No. 09/717,927, filed Nov. 20, 2000 now U.S. Pat. No. 6,527,925.

TECHNICAL FIELD

The present invention relates generally to methods and apparatuses for providing electrical and fluid communication to rotating microelectronic workpieces during electrochemical processing.

BACKGROUND

Semiconductor integrated circuits and other microelectronic devices typically include a substrate or workpiece, such as a silicon wafer, and one or more metal layers disposed on the workpiece. The metal layers are typically used to interconnect components of the integrated circuit. Metal layers may also define devices such as read/write heads, micro electrical-mechanical devices, and other microelectronic structures. The metal layers can be formed from metals such as nickel, tungsten, solder, platinum, and copper. The metal layers can be formed on the workpiece with techniques such as chemical vapor deposition (CVD), physical vapor deposition (PVD), electroplating, and electroless plating.

In one electrochemical plating process, a very thin seed layer of metal is applied to the workpiece using physical or chemical vapor deposition and is deposited to a thickness of approximately 1,000 angstroms. An electrical current is applied to the seed layer while the workpiece is immersed in an electrochemical processing fluid to form a thicker blanket layer on the seed layer. The blanket layer can have a thickness of layer while the workpiece is immersed in an electrochemical processing fluid to form a thicker blanket layer on the seed layer. The blanket layer can have a thickness of approximately 6,000 to 15,000 angstroms and can fill trenches, vias and other apertures in the workpiece to provide electrically conductive features within the apertures. After the blanket layer has been electroplated onto the workpiece, excess metal material can be removed (for example, using chemical-mechanical planarization) and subsequent structures can then be disposed on the resulting metal layer.

Figure 1:
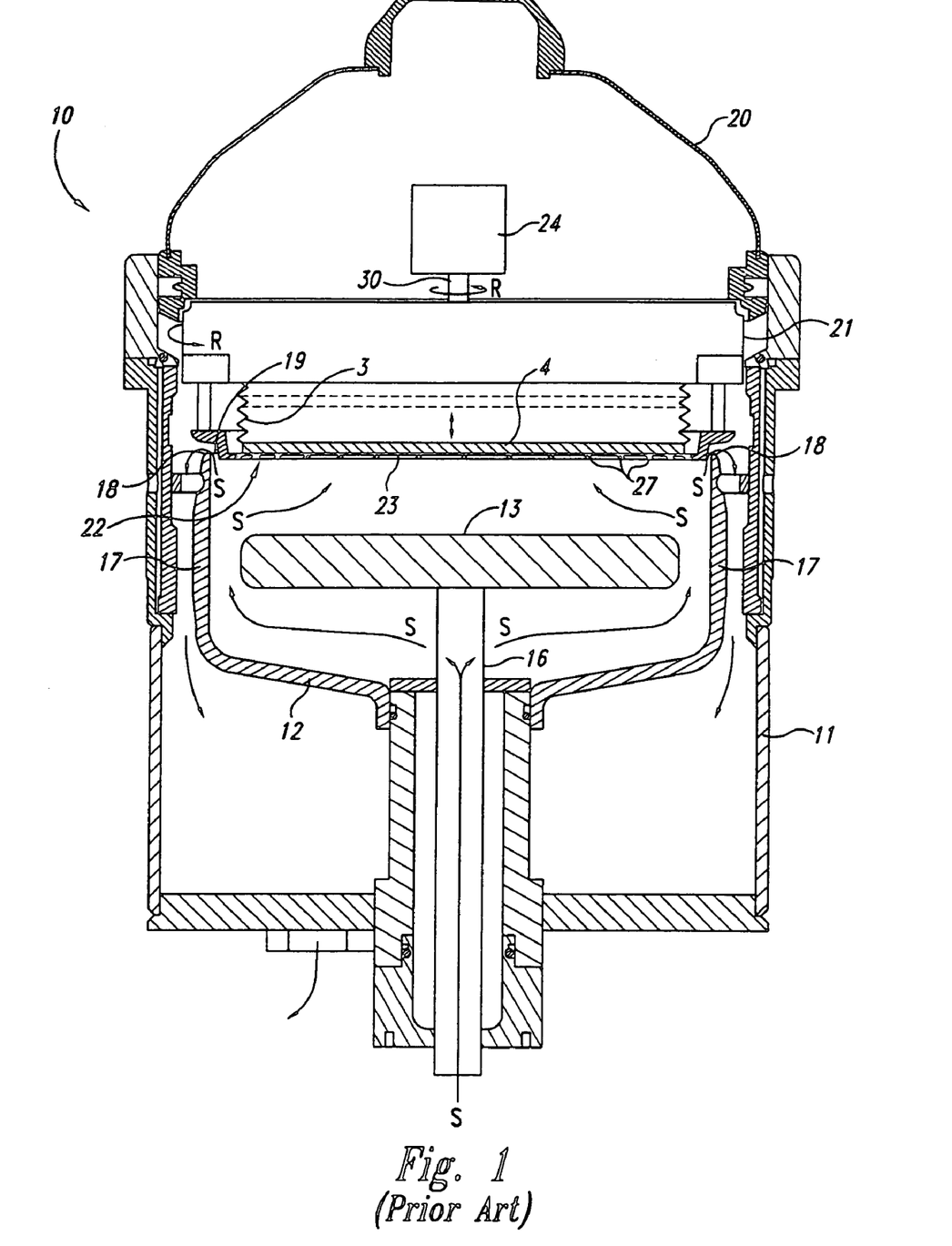
FIG. 1 is a cross-sectional side elevational view of an electrochemical processing reactor in accordance with the prior art.

FIG. 1 is a cross-sectional side elevational view of a conventional apparatus 10 for electroplating a microelectronic workpiece 23. The apparatus 10 includes a cup 12 supplied with electrochemical processing fluid via a supply tube 16. The supply tube 16 also supports a positively charged anode 13. The cup 12 includes sidewalls 17 having an upper edge 18 that defines a free surface 19 of the processing fluid. The processing fluid flows through the supply tube 16, into the cup 12 and over the sidewalls 17 into an overflow vessel 11, as indicated by arrows "S." The fluid can be removed from the bottom of the overflow vessel 11 for disposal or recirculation.

A reactor head 20 supports the microelectronic workpiece 23 relative to the processing fluid in the cup 12 and is movable relative to the cup 12 and the overflow vessel 11 between a closed position (shown in FIG. 1) with the workpiece 23 in contact with the processing fluid, and an open position. The reactor head 20 includes a workpiece support or rotor 21 that supports the microelectronic workpiece 23 in a face-down orientation. The support 21 includes a contact assembly 22 having a plurality of electrical contact points 27 that can be removably coupled to a conductive surface (such as a seed layer) of the microelectronic workpiece 23. A backing plate 4 biases the workpiece 23 into engagement with the contact points 27 and is moveable relative to the workpiece 23 between an engaged position (shown in solid lines in FIG. 1) and a disengaged position (shown in broken lines in FIG. 1). A bellows seal 3 surrounds the backing plate 4. The support 21 is rotatably coupled to the reactor head 20 with a shaft 30 connected to a motor 24. Accordingly, the support 21 and the workpiece 23 can rotate relative to the reactor head 20 and the cup 12 (as indicated by arrows "R") while a negative electrical charge is applied to the electrical contact points 27 to attract conductive ions in the processing fluid to the conductive surface of the workpiece 23.

Figure 2:
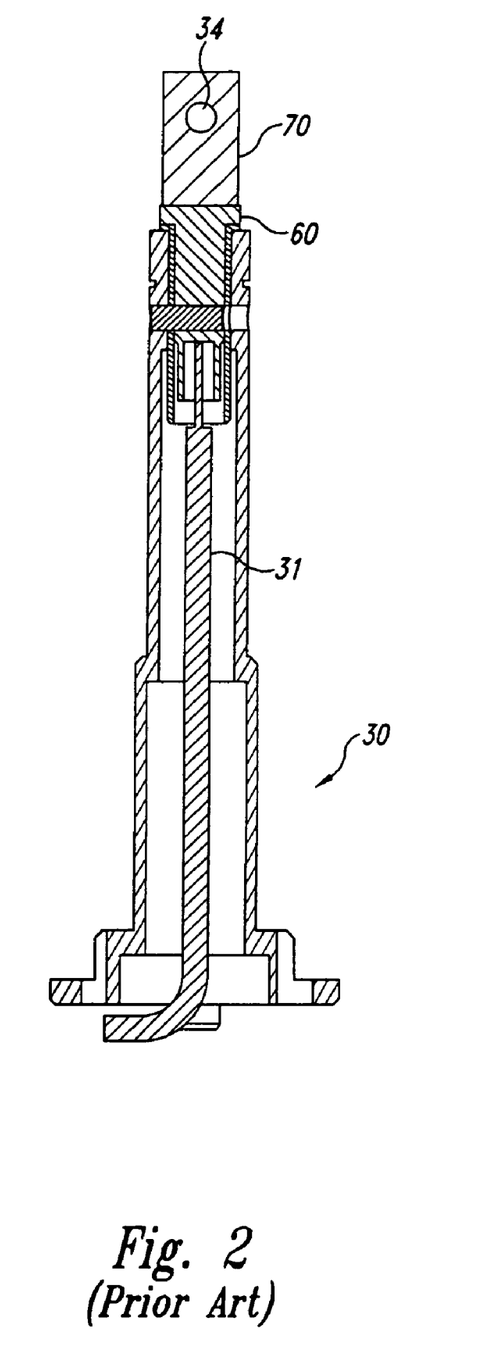
FIG. 2 is a cross-sectional side elevational view of a shaft having a rotary electrical connection in accordance with the prior art.

In one aspect of the conventional arrangement shown in FIG. 1, electrical power is transmitted from the non-rotating reactor head 20 to the rotating microelectronic workpiece 23 via a rotating electrical connection. For example, as shown in FIG. 2, the shaft 30 can include a conductor 31 connected at a lower end to the contact assembly 22 (FIG. 1) and connected at an upper end to a rotary contact 60 that rotates with the shaft 30. The reactor head 20 (FIG. 1) can support a fixed contact 70 that is connected with a cable 34 to a power source (not shown). Accordingly, the shaft 30 and the rotary contact 60 rotate relative to the fixed contact 70 while maintaining electrical contact with the fixed contact 70 and the microelectronic workpiece 23.

In another conventional arrangement, it may be advantageous to purge oxygen from a region proximate to the junction between the microelectronic workpiece 23 (FIG. 1) and the contact assembly 22, for example, to minimize etching of the seed layer and/or reduce the likelihood for oxidizing the seed layer. Accordingly, the apparatus 10 (FIG. 1) can include a purge fluid pathway that provides purge fluid to the support 21 via the shaft 30. In one aspect of this arrangement (shown in FIG. 3), the shaft 30 can include a fluid channel 41 having an entrance port 45 at one end and an exit port 44 at the opposite end. The entrance port 45 extends through the rotary contact 60 and aligns with an axial supply passage 71 extending through the fixed contact 70. The fixed contact 70 also includes a fluid connector 72 for coupling to a source of purge fluid (not shown). Accordingly, the purge fluid can be supplied to the fluid connector 72, through the fixed contact 70, through the rotary contact 60, and through the shaft 30 to the junction region between the microelectronic workpiece 23 and the contact assembly 22.

SUMMARY

The invention is directed to apparatuses and methods for transmitting electrical signals and fluids to and/or from a microelectronic workpiece. In one aspect of the invention, the apparatus can include a shaft rotatable about a shaft axis.

The shaft can have a first end with a first electrical contact portion toward the first end, a second end opposite the first end, and an internal channel along the shaft axis between the first and second ends. The shaft can further have at least one first hole toward the first end extending radially from the channel to an external surface of the shaft. At least one second hole extends through the shaft from the channel to the external surface of the shaft toward the second end of the shaft. A housing rotatably receives the shaft, and the housing has an aperture coupleable to a fluid source and/or a fluid sink. The housing has a fluid passage positioned adjacent to at least one first hole of the shaft, with the fluid passage in fluid communication with the aperture when the shaft rotates relative to the housing. The housing has a second electrical contact portion engaged with the first electrical contact portion to transmit electrical signals between the first and second electrical contact portions when the shaft rotates relative to the housing.

In a further aspect of the invention, the apparatus can include an inner race fixed relative to the shaft to rotate with the shaft, and an outer race fixed relative to the housing. A first ball-bearing assembly is positioned between the inner race and the housing, and a second ball-bearing assembly is positioned between the inner race and the housing at an axial distance from the first ball-bearing assembly. A first seal is fixed relative to the outer race and is engaged with the inner race proximate to the first ball-bearing assembly, and a second seal is fixed relative to the outer race and engaged with the outer race proximate to the second ball bearing assembly. The inner race, the outer race, and the first and second seals define the fluid passage of the housing.

In still a further aspect of the invention, the housing and the shaft can be included in an apparatus for electrochemically processing a microelectronic workpiece. The apparatus can further include a reactor vessel, a cup disposed in the reactor vessel and having a sidewall to define a level of process fluid within the cup when the process fluid is disposed in the cup, and an anode disposed in the cup and coupleable to a source of electrical potential. A support coupled to the shaft supports the microelectronic workpiece for rotation during electrochemical processing.

The invention is also directed toward a method for transmitting electrical signals and fluids to and/or from a microelectronic workpiece. The method can include transmitting electrical power from a housing to a shaft by engaging a first electrical contact fixed relative to the housing with a second electrical contact fixed relative to the shaft while the shaft rotates relative to the housing about a shaft axis. The method can further include electrically coupling the shaft to the microelectronic workpiece and coupling fluid in an axial channel of the shaft with fluid in the housing. The coupling can be accomplished by aligning, with a fluid passage in the housing, a radial first opening extending from the axial channel to an external surface of the shaft proximate to a first end of the shaft while the shaft rotates relative to the housing and while a second opening proximate to a second end of the shaft is in fluid communication with the surface of the microelectronic workpiece.

DETAILED DESCRIPTION

The present disclosure describes methods and apparatuses for providing fluid and electrical communication with a rotating microelectronic workpiece during electrochemical processing. Many specific details of certain embodiments of the invention are set forth in the following description and FIGS. 4-9 to provide a thorough understanding of these embodiments. One skilled in the art, however, will understand that the present invention may have additional embodiments, or that the invention can be practiced without several of the details described below.

Figure 3:
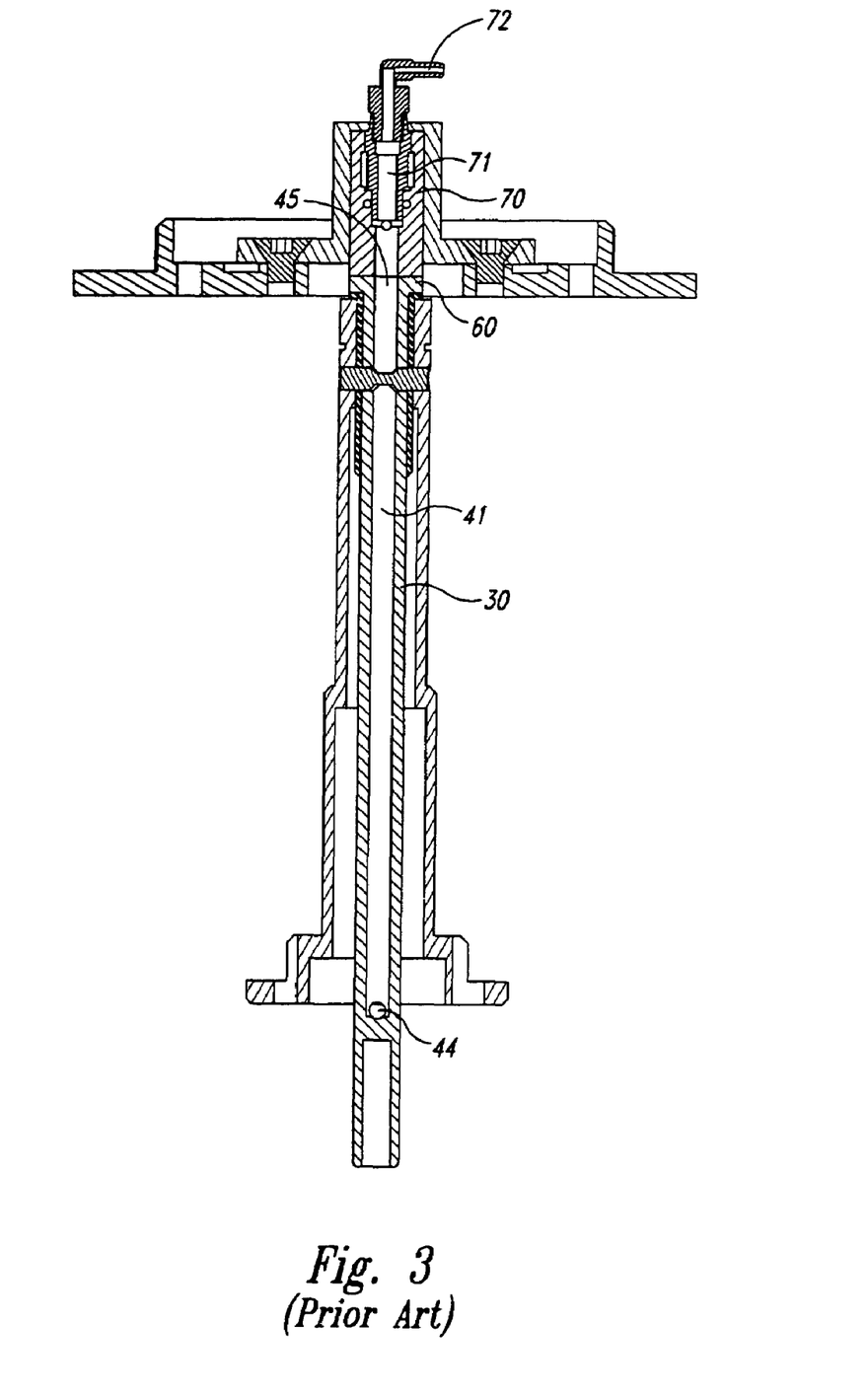
FIG. 3 is a cross-sectional side elevational view of another shaft having a rotary electrical and fluid connection in accordance with the prior art.

One potential drawback of the conventional arrangement shown in FIG. 3 is that the rotary contact 60 and the fixed contact 70 may need to be enlarged in the radial direction to both accommodate the fluid channel 41 and provide a low-resistance link for electrical power. Accordingly, the linear speed at the outer edge of the rotary contact 60 can increase compared to a contact that does not include the fluid channel 41. As a result, both the rotary contact 60 and the fixed contact 70 can wear at an increased rate as a result of the higher edge velocity of the rotary contact 60.

Figure 4:
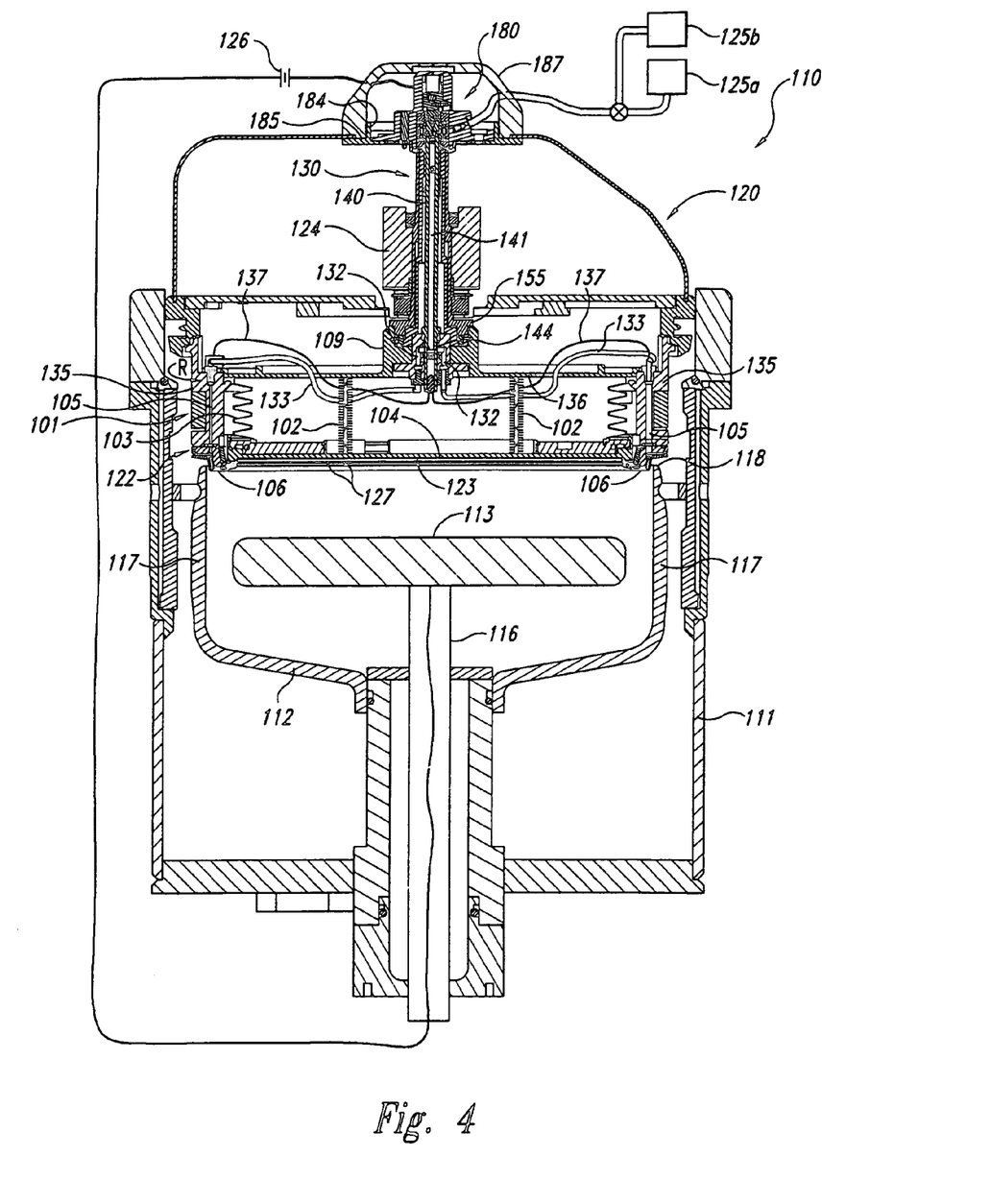
FIG. 4 is a cross-sectional side elevational view of a reactor that includes a reactor head coupled to a shaft with a rotary electrical and fluid coupling in accordance with an embodiment of the present invention.

FIG. 4 is a partially schematic, cross-sectional side elevational view of an electrochemical processing reactor 110 in accordance with an embodiment of the invention. In one aspect of this embodiment, the reactor 110 can include a reactor head 120 having a fixed housing 180 coupled to a rotatable support 101. The support 101 can support a microelectronic workpiece 123 relative to a cup 112. The cup 112 can have upwardly disposed sidewalls 117 defining an upper edge 118, and the cup 112 can be supported by a supply tube 116 that supplies process fluid to the cup 112. The process fluid flows upwardly into the cup 112, around an anode 113, and over the upper edge 118 of the sidewalls 117 to define a free surface that engages the microelectronic workpiece 123, as was generally described above. The process fluid flowing out of the cup 112 is collected in an overflow vessel 111 for removal and/or recycling.

In one embodiment, the anode 113 can be coupled to an electrical power source 126 and supported on the supply tube 116 in a manner generally similar to that disclosed in co-pending U.S. patent application Ser. No. 09/112,300 incorporated herein in its entirety by reference. The cup 112 can include a single element anode 113 as shown in FIG. 4, or multiple annular anode elements, as disclosed in co-pending U.S. patent application Ser. No. 09/525,930 and published pending PCT Application No. US00/10120, both incorporated herein in their entireties by reference. In other embodiments, the anode can have other configurations.

In any of the foregoing embodiments, the anode 113 can be used to dispose a metallic material on the microelectronic workpiece 123 by electrolytic deposition. As used herein, the term microelectronic workpiece refers generally to a workpiece used for forming microelectronic devices, such as integrated circuits, memory chips and/or other semiconductor devices. The term microelectronic workpiece can include a substrate material with or without other materials (such as metal materials) applied thereto, and can also refer to workpieces that define microelectronic devices such as read/write heads that may or may not have semiconductor features.

The microelectronic workpiece 123 can be supported at the free surface of the process fluid by the rotatable support member 101. In one embodiment, the support member 101 can include a central hub 109 connected to an outwardly extending flange 136. The flange 136 can support a generally cylindrical outer rim 135 connected to a contact assembly 122. The contact assembly 122 can provide electrical current to the microelectronic workpiece 123 during an electrochemical process. Accordingly, the contact assembly 122 can have a configuration generally a similar to that disclosed in U.S. Pat. No. 6,080,291 and can include a plurality of contact points 127 that engage a pre-existing conductive portion (such as a seed layer) of the microelectronic workpiece 123. Alternatively, the contact assembly 122 can have other configurations. In either embodiment, the support member 101 can include a plurality of springs 102 that bias a backing plate 104 against an upwardly facing surface of the microelectronic workpiece 123. The downwardly facing surface of the microelectronic workpiece 123 can accordingly be biased into engagement with the contact assembly 122 to provide a secure et disengageable electrical connection with the workpiece 123. An expandable bellows 103 can be disposed about the springs 102 and other components of the support member 101 to protect these components from contact with the electrochemical processing fluid in the cup 112.

The support member 101 can be rotatably mounted to the reactor head 120 with a shaft assembly 130. Accordingly, the reactor head 120 can include a motor 124 having a rotating output shaft 155 coupled to the shaft assembly 130 and/or coupled directly to the central hub 109 of the support member 101 to rotate the support member 101 relative to the reactor head 120, as indicated by arrow "R." The housing 180 can receive an upper portion of the shaft assembly 130 to provide an electrical and fluid coupling interface between the fixed reactor head 120 and the rotating shaft assembly 130. Accordingly, the housing 180 can be connected to the electrical power source 126 and a fluid source 125a or fluid sink 125b, (all shown schematically in FIG. 4) to provide simultaneous electrical and fluid communication with the microelectronic workpiece 123 as the workpiece 123 rotates. The reactor head 120 can include a housing support 184 having a housing support flange 185 to support the housing 180 in position. A housing cover 187 can be disposed around the housing 180 to protect the housing 180 and the connections within it from adverse environmental elements.

Figure 5:
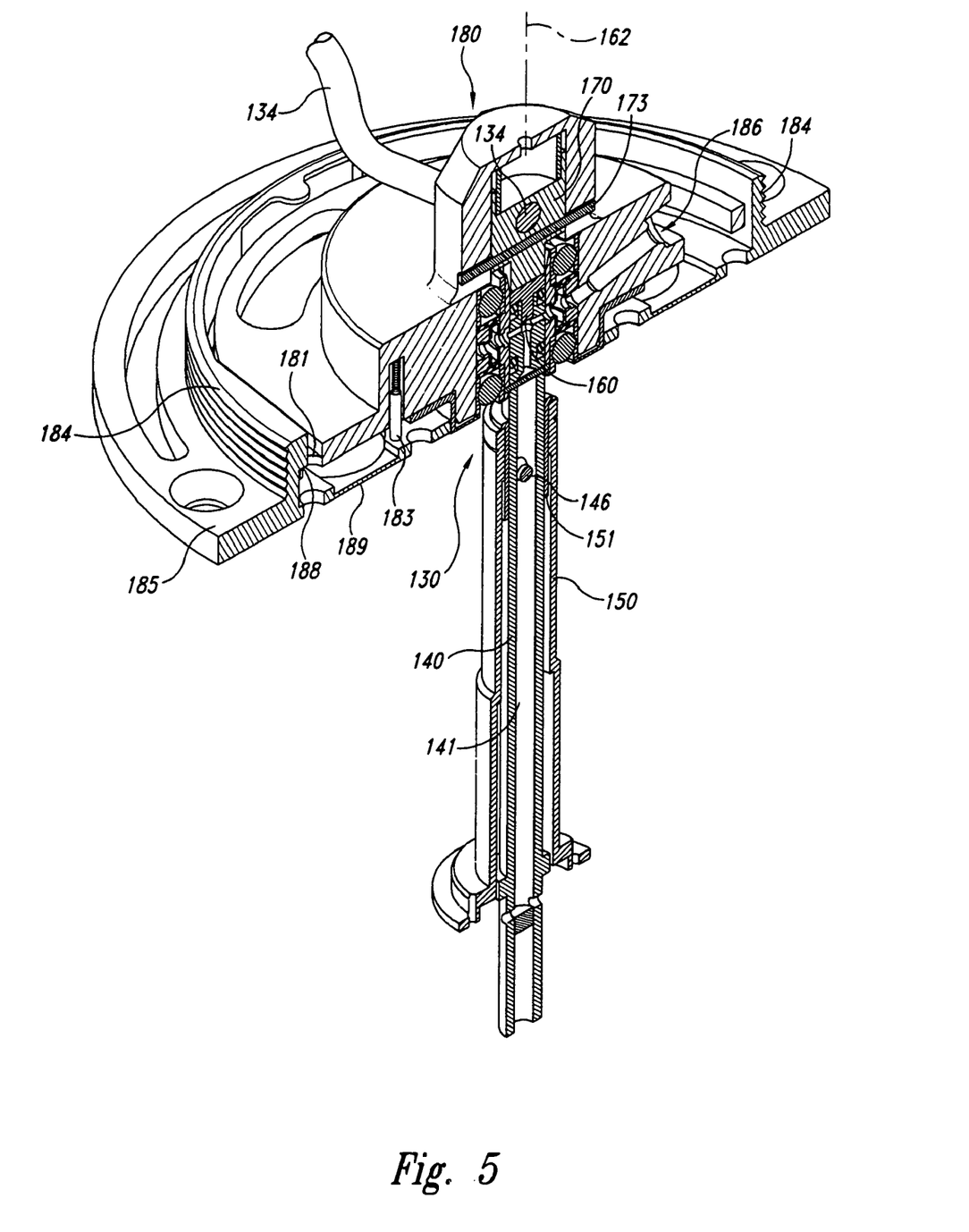
FIG. 5 is a cut-away, top isometric view of a portion of the reactor head having the rotary coupling shown in FIG. 4.

FIG. 5 is a cut-away, top isometric view of the housing 180 and the shaft assembly 130 in accordance with an embodiment of the invention. In one aspect of this embodiment, the housing 180 can be connected to the housing support 184 with a releasable bayonet fitting. Accordingly, the housing 180 can include a housing flange 181 that fits under an overhanging portion 188 of the housing support 184. The housing 180 can further include spring pins 183 (shown schematically in FIG. 5) that press downwardly against an inner rim 189 of the housing support 184. Accordingly, the spring pins 183 can press the housing flange 181 upwardly against the overhanging portion 188 to releasably secure the housing 180 to the housing support 184.

The housing 180 can include a fixed electrical contact 170 removably connected to the housing 180 with a dowel pin 173. The fixed contact 170 can be connected to a cable 134 which is in turn connected to the source of electrical potential 126 (FIG. 4). The fixed contact 170 engages a rotary contact 160 of the shaft assembly 130 to transmit electrical power to the shaft assembly 130 and the microelectronic workpiece 123 (FIG. 4), as described in greater detail below. The housing 180 can also include a fluid aperture 186 coupled to the fluid source 125a or fluid sink 125b (FIG. 4) to transfer fluid to and/or from the shaft assembly 130, as is also described in greater detail below.

In one embodiment, the shaft assembly 130 can include a conductive inner shaft 140 having a fluid channel 141 for transporting fluid to and/or from the microelectronic workpiece 123. An outer shaft 150 can be disposed concentrically about the inner shaft 140. In one aspect of this embodiment, the outer shaft 150 can be electrically isolated from the inner shaft 140 by an insulating collar 151. Accordingly, the outer shaft 150 can mechanically and/or electrically shield the inner shaft 140. A shaft pin 146 connects the inner shaft 140 to the outer shaft 150 so that both rotate together. The outer shaft 150 is received in an annular opening of the output shaft 155 (FIG. 4) and is fixed relative to the output shaft 155. Accordingly, the output shaft 155, the outer shaft 150, and the inner shaft 140 rotate as a unit about a rotation axis 162 when the motor 124 (FIG. 4) is activated.

Figure 6:
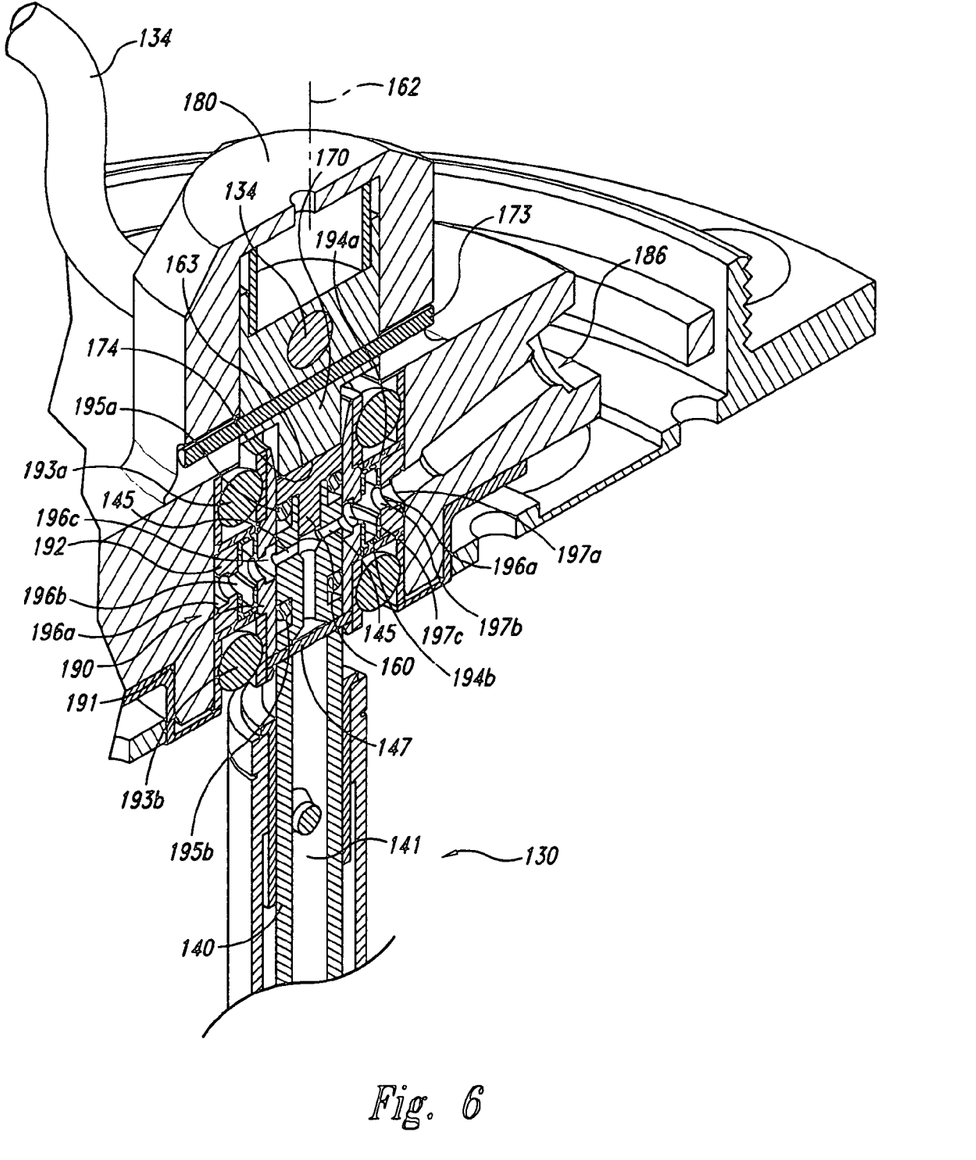
FIG. 6 is an enlarged view of a portion of the rotary coupling shown in FIG. 5.

FIG. 6 is an enlarged, cut-away side isometric view of portions of the housing 180 and the shaft assembly 130 described above with reference to FIG. 5. The upper portion of the shaft assembly 130 includes the rotary contact 160, which can have an upwardly facing rotary contact surface 163 that engages a corresponding downwardly facing contact surface 174 of the fixed contact 170. In one aspect of this embodiment, the rotary contact surface 163 is intersected by the rotation axis 162. Accordingly, the radius of the rotary contact surface 163 can be less than the radius of some conventional contact surfaces having the same surface area but having an axial aperture for transmitting fluids to the shaft assembly (see, for example, FIG. 3). Therefore, the linear velocity of the outer edge of the rotary contact surface 163 can be less than the linear velocity of a corresponding contact surface having a larger radius. An advantage of this feature is that the rate at which the contact surfaces 163 and 174 wear, and the likelihood for forming chips or other debris that can interfere with electrochemically processing the microelectronic workpiece 123, can be reduced when compared with some conventional arrangements. At the same time, the rotary contact surface 163 can have an area equivalent to that of some conventional contact surfaces, and can accordingly transmit electrical power with at least the same efficiency as such conventional devices.

In a further aspect of this embodiment, the rotary contact 160 can be removably attached to the inner shaft 140, and the fixed contact 170 can be removably attached to the housing 180. Accordingly, the contacts 160 and 170 can be removed and replaced without replacing the entire shaft assembly 130 and/or the entire housing 180. In an alternate embodiment, the rotary contact 160 can be formed integrally with the inner shaft 140 and the fixed contact 170 can be formed integrally with the housing 180. In either embodiment, the materials of the rotary contact 160 and the fixed contact 170 can be selected to reduce the rate at which the contacts wear, relative to some conventional arrangements. For example, the rotary contact 160 can include phosphor bronze and/or coined silver, and the fixed contact 170 can include silver graphite. In other embodiments, the contacts 160 and 170 can include other materials that provide high wear resistance and low electrical resistance. When the rotary contact 160 is removably attached to the inner shaft 140, the rotary contact 160 can include a material composition different than that of the inner shaft 140. Accordingly, the inner shaft 140 can include a less wear-resistant (and/or less expensive) material. For example, the inner shaft 140 can be formed from stainless steel.

In another aspect of this embodiment, the shaft assembly 130 and the housing 180 can include a seal and bearing assembly 190 that provides a fluid-tight, rotary connection between the non-rotating housing 180 and the rotating shaft assembly 130. For example, the bearing assembly 190 can include an annular, rotating inner race 191 pinned to the inner shaft 140 with a race pin 147, and an annular, non-rotating outer race 192 attached to the housing 180. Two O-rings 195 (shown as an upper O-ring 195a and a lower O-ring 195b) can seal the interface between the inner race 191 and the inner shaft 140. Two bearings 193 (shown as an upper bearing 193a and a lower bearing 193b) can be disposed between the inner race 191 and the housing 180 to support the inner shaft 140 relative to the housing 180 and allow the inner shaft 140 to rotate freely relative to the housing 180. In one embodiment, the bearings 193 can include conventional sealed and/or shielded ball bearing assemblies, each having an inside race engaged with the inner race 191, an outside race engaged with the housing 180, and a plurality of ball bearings between the inside race and the outside race. In other embodiments, the bearings 193 can have other configurations. In either embodiment, two lip seals 194 (shown as an upper lip seal 194a and a lower lip seal 194b) can seal the interfaces between the inner race 191, the bearings 193, and the outer race 192.

In one embodiment, the inner race 191, the bearings 193, the outer race 192 and the lip seals 194 define a series of three concentric, annular plenums 196 (shown as plenums 196a-c) connected with plenum openings 197 (shown as openings 197a-b) for transmitting fluids between the channel 141 and the fluid aperture 186. For example, the plenums can include an annular outer plenum 196a, an annular intermediate plenum 196b disposed radially inwardly from the outer plenum 196a, and an annular inner plenum 196c disposed radially inwardly from the intermediate plenum 196b. An outer plenum opening 197a connects the outer plenum 196a with the fluid aperture 186. One or more intermediate plenum openings 197b provide fluid communication between the outer plenum 196a and the intermediate plenum 196b. One or more inner plenum openings 197c provide fluid communication between the intermediate plenum 196b and the inner plenum 196c. One or more channel entrance openings 145 extend radially inwardly through an outer surface of the inner shaft 140 to the channel 141 to provide fluid communication between the inner plenum 196c and the channel 141. The channel entrance openings 145 are axially aligned with the inner plenum 196c to complete the fluid path between the channel 141 and the fluid aperture 186.

In one aspect of this embodiment, fluid communication between the channel 141 and the fluid aperture 186 is continuous as the shaft assembly 130 rotates relative to the housing 180. Alternatively, the fluid communication can be intermittent. For example, in one alternate embodiment, the plenums 196a-c can be eliminated and the fluid aperture 186 can extend to the outer surface of the inner shaft 140. Accordingly, fluid communication between the channel 141 and the fluid aperture 186 occurs intermittently whenever one of the (rotating) channel entrance openings 145 aligns with the (fixed) fluid aperture 186. In other embodiments, the interface between the inner shaft 140 and the fluid aperture 186 can have other arrangements, so long as fluid communication between the two occurs at least intermittently.

Returning now to FIG. 4, the channel 141 of the inner shaft includes exit apertures 144 toward the lower end of the inner shaft 140. The exit apertures 144 can extend radially outwardly from the channel 141 (as shown in FIG. 4) or alternatively, the exit apertures can extend axially to the outer surface of the inner shaft 140. In either embodiment, the exit apertures 144 can be in fluid communication with axial channels 132 that extend downwardly through the central hub 109 of the support member 101. Flexible fluid lines 133 connect the axial channels 132 to outer axial channels 105 positioned in the outer rim 135 of the support member 101. The outer axial channels 105 are in fluid communication with an annular plenum 106 adjacent to the microelectronic workpiece 123, as described in greater detail below with reference to FIG. 7.

In one aspect of this embodiment, the support member 101 can include electrical cables 137 that removably plug into the lower portion of the inner shaft 140. The cables 137 attach to posts (not visible in FIG. 4) in the outer rim 135, and the posts attach to the contact assembly 122 to provide a conductive link between the conductive inner shaft 140 and the contact assembly 122. In other embodiments, the support member 101 can include other arrangements to electrically link the inner shaft 140 with the contact assembly 122. In either embodiment, the contact assembly 122 and the support member 101 can provide electrical contact with the microelectronic workpiece 123, and can provide fluid communication between the microelectronic workpiece 123 and the shaft assembly 130, as described in greater detail below.

Figure 7:
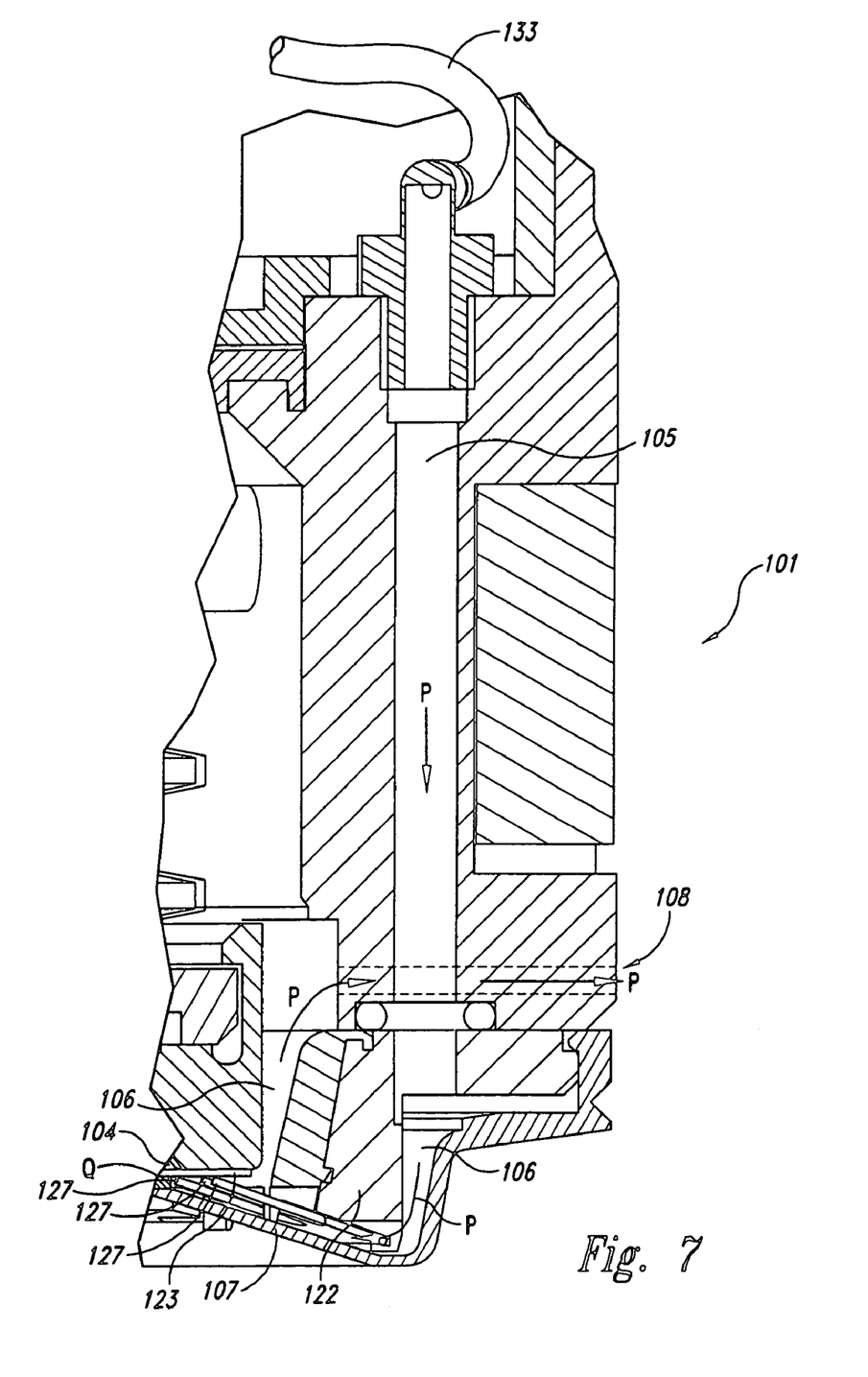
FIG. 7 is an enlarged view of a portion of the reactor head shown in FIG. 4 supporting a microelectronic workpiece in accordance with an embodiment of the invention.

FIG. 7 is an enlarged side elevational view of a lower portion of the support member 101 and the microelectronic workpiece 123 described above with reference to FIG. 4. In one aspect of this embodiment, the lower portion of the support member 101 includes a seal 107 that defines (in part) the annular plenum 106 adjacent to the microelectronic workpiece 123. The seal 107 can form an at least partially liquid-tight seal against the downward facing surface of the microelectronic workpiece 123 at a sealing surface Q to protect an interface between the contact assembly 122 and the microelectronic workpiece 123 from contact with the surrounding processing fluid. The contact assembly 122 can bias the contact points 127 upwardly against a conductive portion of the microelectronic workpiece 123 while the backing pate 104 biases the microelectronic workpiece 123 downwardly to provide a secure, dry electrical connection between the contact points 127 and the microelectronic workpiece 123.

In one embodiment, a purge gas (such as nitrogen) can pass downwardly through the outer axial channel 105 into the plenum 106, then radially inwardly from the plenum 106 to a region adjacent to the downward facing surface of the microelectronic workpiece 123, as indicated by arrows "P." The purge gas can then pass upwardly and outwardly through interstices between the contact points 127, and exit the support member 101 through exit slots 108. Accordingly, the purge gas can provide a low-moisture, inert environment at the interface between the contact points 127 and the microelectronic workpiece 123. An advantage of this arrangement is that the microelectronic workpiece 123 and the contact points 127 will be less likely to oxidize in this environment and the seed layer can be less likely to etch.

In another embodiment, fluid can travel in a direction opposite to that described above with reference to the arrows "P" by coupling the fluid aperture 186 (FIG. 4) to the fluid sink 125b (FIG. 4). Accordingly, the fluid sink 125b can draw the seal 107 more tightly against the microelectronic workpiece 123 to further reduce potential contact between the contact points 127 and the processing fluid. In other embodiments, the processing fluid can come into contact with the contact points 127 and the seal 107 can be eliminated. In still further embodiments, the fluid aperture 186 can provide fluid services other than purge fluid or vacuum to the microelectronic workpiece 123 while the microelectronic workpiece 123 rotates.

One feature of an embodiment of the housing 180 and the shaft assembly 130 described above with reference to FIGS. 4-7 is that fluid is transported from the fluid aperture 186 to the channel 141 (or vice versa) by passing radially into the channel 141 through the channel entrance openings 145. Accordingly, the channel entrance openings 145 can be spaced axially from the rotary contact 160 and need not pass through the rotary contact 160. As described above, the rotary contact 160 can accordingly have a smaller radial extent than it otherwise would. An advantage of this feature is that the rotary contact 160 can wear at a slower rate than conventional contacts.

Another feature of an embodiment of the apparatus described above with reference to FIGS. 4-7 is that the lip seals 194 and the O-rings 195 can provide a fluid-tight barrier between the channel 141 and the contacts 160 and 170. Accordingly, any particles that might be released from the contacts 160 and 170 during operation will be less likely to become entrained in the fluid passing through the channel 141, and accordingly will be less likely to contaminate the microelectronic workpiece 123.

Figure 8:
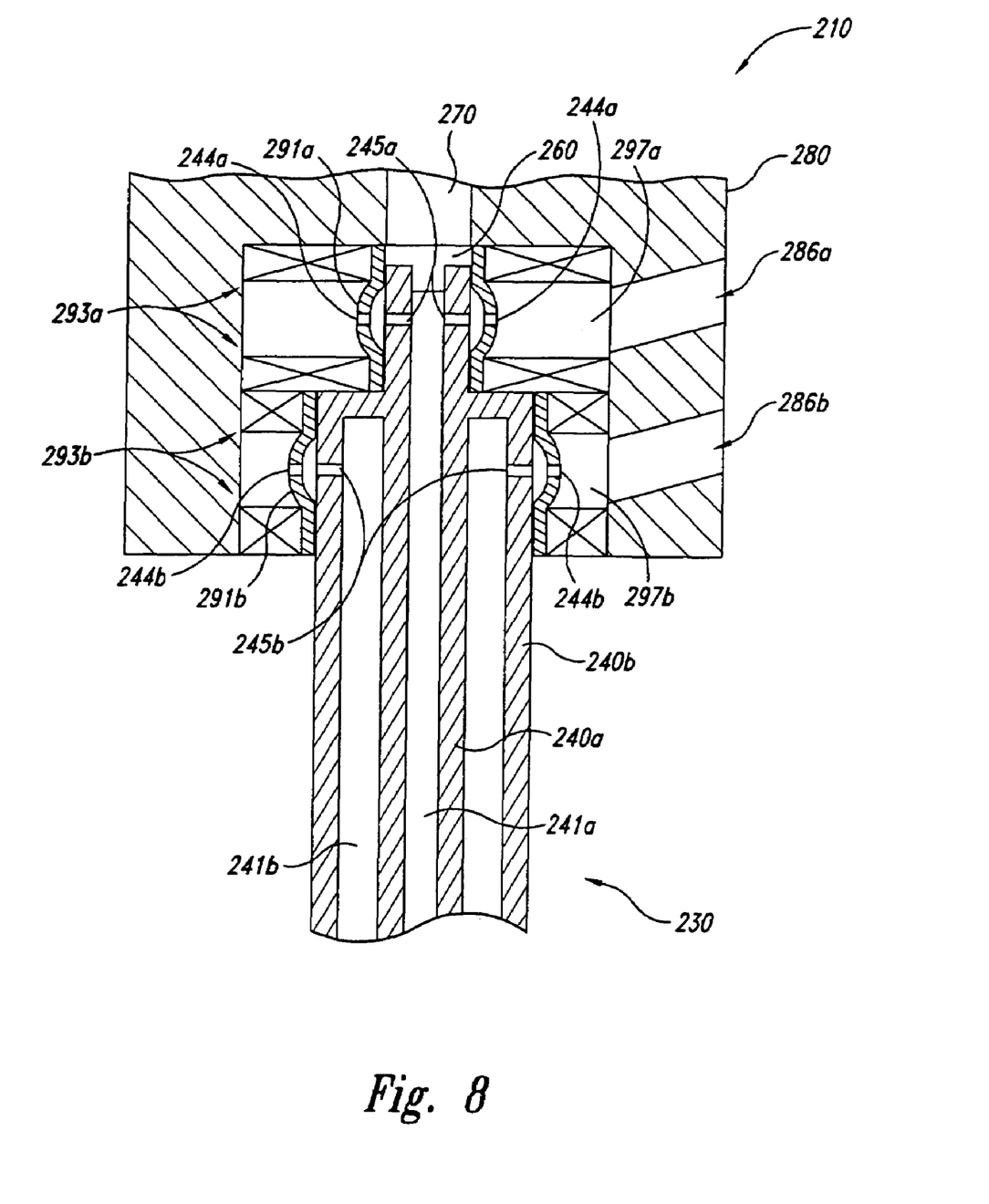
FIG. 8 is a partially schematic, cross-sectionial side elevational view of a shaft having two fluid couplings and an electrical coupling in accordance with an embodiment of the invention.

FIG. 8 is a partially schematic, cross-sectional side elevational view of a portion of an apparatus 210 having a plurality of channels for transporting fluids to and/or from a microelectronic workpiece 123 (FIG. 4) during electrochemical processing in accordance with another embodiment of the invention. For purposes of illustration, seals between several of the components of the apparatus 210 are not shown in FIG. 8. In one aspect of this embodiment, the apparatus 210 can include a housing 280 (a portion of which is shown in FIG. 8) having a fixed contact 270. The housing 280 can rotatably support a shaft assembly 230 (a portion of which is shown in FIG. 8) having a rotatable contact 260 that engages the fixed contact 270 when the shaft assembly 230 rotates. The shaft assembly 230 can include an inner shaft 240a having a first channel 241a, and an outer shaft 240b having a second channel 241b. The apparatus 210 can include a first inner race 291a disposed about the inner shaft 240a and a second inner race 291b disposed about the outer shaft 240b. First bearings 293a can be disposed between the housing 280 and the first inner race 291a, and second bearings 293b can be disposed between the housing 280 and the second inner race 291b to permit the shaft assembly 230 to rotate relative to the housing 280. The housing 280 can include a first fluid aperture 286a that communicates with the first channel 241a, and a second fluid aperture 286b that communicates with the second channel 241b, as described below.

The housing 280 can further include a first plenum 297a positioned to couple the first fluid aperture 286a with the first channel 241a. Accordingly, the first plenum 297a can provide a fluid passage between the first fluid aperture 286a and one or more openings 244a in the first inner race 291a and one or more openings 245a in the inner shaft 240a. The housing 280 can still further include a second plenum 297b disposed circumferentially about the shaft assembly 230 and in fluid communication with the second fluid aperture 286b. Openings 244b in the second inner race 291b and openings 245b in the outer shaft 240b provide fluid communication between the second plenum 297b and the second fluid aperture 286b as the shaft assembly 230 rotates relative to the housing 280.

One feature of an embodiment of the arrangement described above with reference to FIG. 8 is that multiple fluid apertures 286 can remain in fluid communication with the microelectronic workpiece 123 simultaneously as the shaft assembly 230 rotates relative to the housing 280. Accordingly, multiple purge fluids can be selectively and simultaneously provided to the microelectronic workpiece 123 or, alternatively, a single purge fluid can be transmitted to the microelectronic workpiece 123 via either the inner shaft 240a or the outer shaft 240b, and the purge fluid can then be withdrawn from the region adjacent to the microelectronic workpiece 123 via the other shaft. In still further embodiments, the apparatus can include more than two fluid apertures coupled independently to a corresponding number of concentric, annular flow channels.

Figure 9:
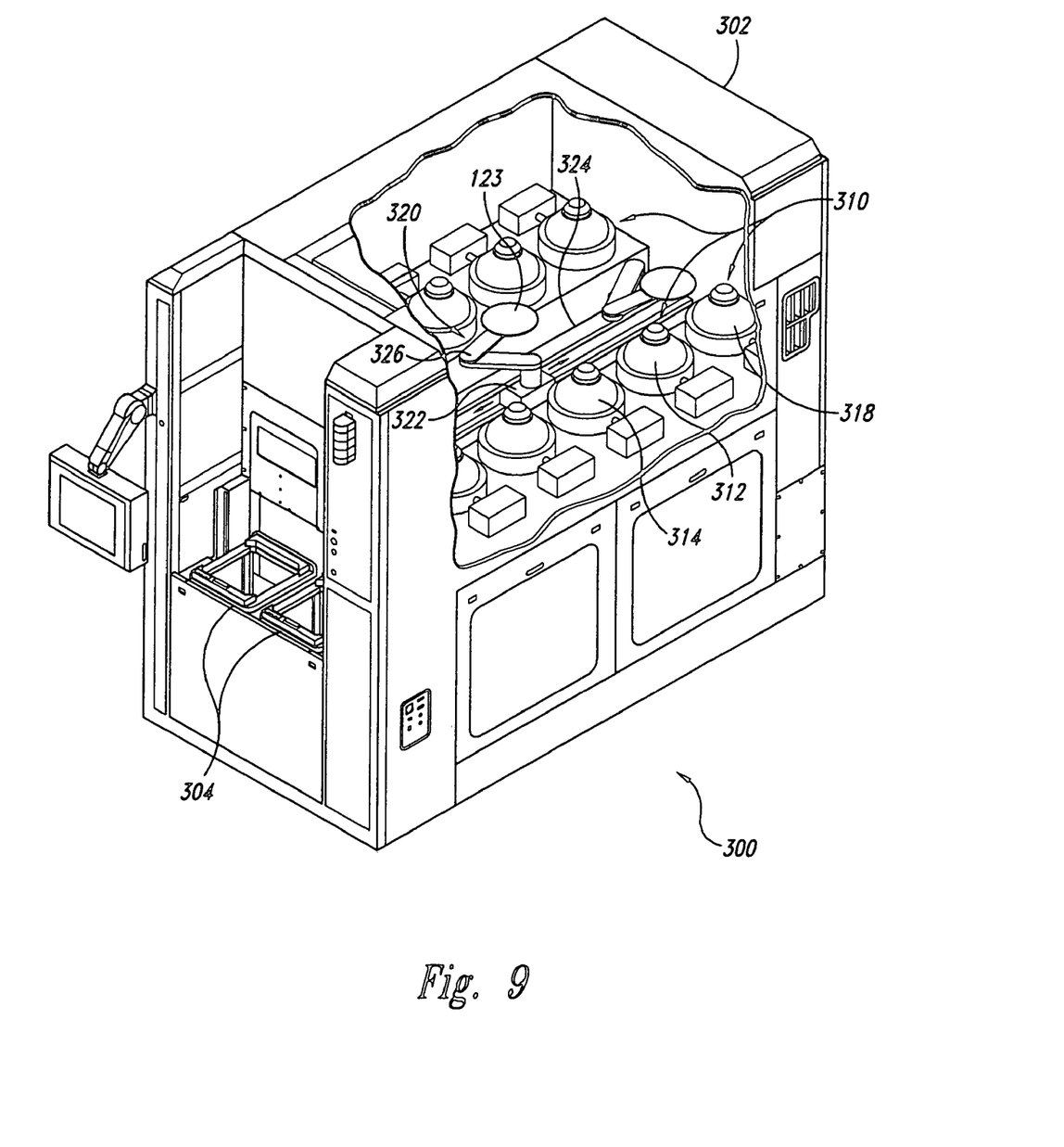
FIG. 9 is an isometric view of an electrochemical processing system that includes a plurality of reactors in accordance with an embodiment of the invention.

FIG. 9 is a front isometric view of an electroplating machine 300 in which rotary couplings in accordance with embodiments of the invention can be used. The electroplating machine 300 can include a cabinet 302, a load/unload mechanism 304 at one end of the cabinet 302, and a plurality of chambers 310 in the cabinet 302. The chambers 310 can include electroplating chambers 312, electroless plating chambers 314, and/or rapid thermal annealing chambers 318. The electroplating chambers 312 can include a rotary electrical and fluid coupling generally similar to any of the embodiments described above with reference to FIGS. 4-8. The electroplating machine 300 can also include a transfer mechanism 320 having a rail or a track 324 and a plurality of robots 322 that move along the track 324. In an alternative embodiment, the transfer mechanism 320 can include a radial system, such as the system incorporated in the EQUINOX® machines manufactured by Semitool, Inc. of Kalispell, Mont. In either embodiment, the robots 322 can include arms 326 that can carry a microelectronic workpiece 123 between the chambers 310.

In operation, the load/unload mechanism 304 positions a cassette holding a plurality of workpieces in the cabinet 302, and the transfer mechanism 320 handles the individual microelectronic workpieces 123 inside the cabinet 302. For example, the transfer mechanism 320 can initially place the workpiece 123 in an electroless plating chamber 314 to repair or enhance the seed layer on the workpiece 123. The transfer mechanism 320 can then remove the workpiece 123 from the electroless plating chamber 314 and place it in the electroplating chamber 312 for forming a blanket layer or a patterned layer on the front face of the workpiece 123. After the electroplating cycle, the transfer mechanism 320 can remove the workpiece 123 from the electroplating chamber 312 and transfer it to another processing station in the machine 300 (e.g., a standard rinse-dryer, a rinse/etch capsule, an annealing chamber, etc.), or place it in the load/unload mechanism 304 for transfer to another location.

From the foregoing it will be appreciated that specific embodiments of the invention have been described herein for purposes of illustration, but that various modifications may be made without deviating from the spirit and scope of the invention. accordingly, the invention is not limited except by the appended claims.

What is claimed is:

1. A method for transmitting electrical signals and fluids to and/or from a microelectronic workpiece, the method comprising:
   electrically coupling a housing to a shaft by axially engaging a first electrical contact fixed relative to the housing with a second electrical contact fixed relative to the shaft while the shaft rotates relative to the housing about a shaft axis;
   electrically coupling the shaft to the microelectronic workpiece;
   coupling fluid in an axial channel of the shaft with fluid in the housing by aligning a fluid passage in the housing with a radial first opening extending from the axial channel to an external surface of the shaft proximate to a first end of the opening proximate to a second end of the shaft is in fluid communication with a surface of the microelectronic workpiece, the fluid passage including a plenum disposed annularly around the shaft; and
   passing the fluid circumferentially around the shaft through the plenum.

2. The method of claim 1, further comprising rotatably supporting the shaft relative to the housing with an inner race engaged with the shaft, and at least one ball bearing disposed between the inner race and the housing.

3. The method of claim 1, further comprising selecting the first electrical contact portion to include a first material and selecting the shaft to include a second material different than the first material.

4. The method of claim 1, further comprising selecting the first electrical contact portion to include a first material and selecting the second electrical contact portion to include a second material different than the first material.

5. The method of claim 1, further comprising selecting the first contact portion to include phosphor bronze and/or coined silver and selecting the second contact portion include silver graphite.

6. The method of claim 1, further comprising removing the first contact portion from the shaft and replacing the first contact portion with another first contact portion.

7. The method of claim 1 wherein coupling the fluid includes passing nitrogen from the housing into the axial channel.

8. The method of claim 1 wherein engaging the first electrical contact with the second electrical contact includes engaging the first electrical contact with a portion of the second electrical contact that intersects the shaft axis.

9. The method of claim 1 wherein coupling the fluid includes drawing fluid away from the surface of the microelectronic workpiece, through the axial channel and into the fluid passage of the housing.

10. The method of claim 1, further comprising:
   positioning an anode proximate to a conductive portion of the microelectronic workpiece;
   disposing a processing fluid between the anode and the microelectronic workpiece; and
   applying an electrical potential to at least one of the anode and the shaft to draw metallic ions toward the microelectronic workpiece.

11. The method of claim 1, further comprising supplying fluid to the fluid passage of the housing and directing the fluid through the radial first opening into the channel, then out of the channel through the second opening and to a region adjacent to the surface of the microelectronic workpiece.

12. The method of claim 1, further comprising:
   moving fluid toward the workpiece by directing the fluid from the plenum, through the radial first opening and into the shaft axial channel while the shaft rotates relative to the housing, and/or moving fluid away from the workpiece by directing the fluid from the workpiece, through the axial channel and the radial first opening into the plenum while the shaft rotates relative to the housing.

13. The method of claim 12, wherein moving fluid toward the workpiece includes directing a purge gas to a region between the microelectronic workpiece and a seal engaged with the microelectronic workpiece proximate to an electrical connection to the microelectronic workpiece.

14. The method of claim 1, further comprising:
   receiving the microelectronic workpiece in a receiving area of an enclosure;
   moving the microelectronic workpiece from the receiving area to a processing chamber within the enclosure with an automated transfer mechanism; and
   transferring the microelectronic workpiece from the automated transfer mechanism to a support member at least proximate to the processing chamber; wherein
   electrically coupling a housing to a shaft includes electrically coupling a housing to a shaft connected to the support member.

15. The method of claim 14, further comprising:
   transferring the microelectronic workpiece from the processing chamber to the automated transfer mechanism;
   moving the automated transfer mechanism and the microelectronic workpiece to at least one of an electroplating chamber, an electroless plating chamber, an annealing chamber and a rinse chamber within the enclosure; and
   transferring the microelectronic workpiece to the receiving area with the automated transfer mechanism.

16. A method for transmitting electrical signals and fluids to and/or from a microelectronic workpiece, the method comprising:
   coupling the microelectronic workpiece to a shaft having a shaft axis;
   rotating the shaft about the shaft axis;
   providing electrical current to the shaft by axially engaging a first electrical contact fixed relative to a housing with a second electrical contact fixed relative to the shaft;
   controlling an amount of wear of the first and/or second electrical contacts by positioning the first and second electrical contacts to intersect the shaft axis while the shaft rotates about the shaft axis;
   coupling fluid in an axial channel of the shaft with fluid in the housing by aligning with a fluid passage in the housing a radial first opening extending from the axial channel to an external surface of the shaft proximate to a first end of the shaft while the shaft rotates relative to the housing and while a second opening proximate to a second end of the shaft is in fluid communication with a surface if the microelectronic workpiece, the fluid passage including a plenum disposed annularly around the shaft; and passing the fluid circumferentially around the shaft through the plenum.

17. The method of claim 16 wherein the second electrical contact has a contact surface with a surface area facing the first electrical contact, and wherein controlling an amount of wear includes reducing an amount of wear relative to an electrical contact having the same surface area and having an axial aperture aligned with the shaft axis for passing fluids to and/or from the shaft.

18. The method of claim 16, further comprising rotatably supporting the shaft relative to the housing with an inner race engaged with the shaft and at least one ball bearing disposed between the inner race and the housing.

19. The method of claim 16, further comprising selecting the first electrical contact portion to include a first material and selecting the shaft to include a second material different than the first material.

20. The method of claim 16, further comprising selecting the first electrical contact portion to include a first material and selecting the second electrical contact portion to include a second material different than the first material.

21. The method of claim 16, further comprising selecting the first contact portion to include phosphor bronze and/or coined silver and selecting the second contact portion include silver graphite.

22. The method of claim 16, further comprising removing the first contact portion from the shaft and replacing the first contact portion with another first contact portion.

23. The method of claim 16, wherein coupling the fluid includes passing nitrogen from the plenum into the axial channel.

24. The method of claim 16 wherein engaging the first electrical contact with the second electrical contact includes engaging the first electrical contact with a portion of the second electrical contact that intersects the shaft axis.

25. The method of claim 16 wherein coupling the fluid includes drawing fluid away from the surface of the microelectronic workpiece, through the axial channel and into the fluid passage of the housing.

26. The method of claim 16, further comprising supplying fluid to the fluid passage of the housing and directing the fluid through the radial first opening into the channel, then out of the channel through the second opening and to a region adjacent to the surface of the microelectronic workpiece.

27. A method for electrochemically processing a microelectronic workpiece, comprising:
    supporting the microelectronic workpiece above an anode with a support coupled to a shaft;
    rotating the shaft relative to a housing adjacent to the shaft to rotate the microelectronic workpiece;
    electrically coupling the housing to the shaft by axially engaging a first electrical contact fixed relative to the housing with a second electrical contact fixed relative to the shaft while the shaft rotates relative to the housing about a shaft axis;
    electrically coupling the shaft to the microelectronic workpiece;
    coupling fluid in an axial channel of the shaft with fluid in the housing by aligning with a fluid passage in the housing a radial first opening extending from the axial channel to an external surface of the shaft proximate to a first end of the shaft while the shaft rotates relative of the housing and while a second opening proximate to a second end of the shaft is in fluid communication with a surface of the microelectronic workpiece, the fluid passage including a plenum disposed annularly around the shaft; and
    passing the fluid circumferentially around the shaft through the plenum.

28. The method of claim 27, further comprising rotatably supporting the shaft relative to the housing with an inner race engaged with the shaft, an outer race engaged with the housing and at least one ball bearing disposed between the inner and outer races.

29. The method of claim 27, further comprising disposing an electrolytic fluid between the anode and the microelectronic workpiece and coupling at least one of the housing and the anode to a source of electrical potential to attract conductive ions to the microelectronic workpiece.

30. A method for transmitting electrical signals and fluids to and/or from a microelectronic workpiece, the method comprising:
    passing an electrical signal to and/or from the microelectronic workpiece along an electrical path that includes a first electrical contact fixed relative to a housing and a second electrical contact fixed relative to a shaft and axially engaged with the first electrical contact while the shaft rotates relative to the housing about a shaft axis;
    passing a fluid to and/or from a region proximate to the microelectronic workpiece along a fluid path includes a fluid passage in the housing, an axial channel in the shaft, a radial first opening extending from the axial channel to an external surface of the shaft proximate to a first end of the shaft, and a second opening proximate to a second end of the shaft that is in fluid communication with a surface of the microelectronic workpiece, by aligning the fluid passage in the housing with the radial first opening while the shaft rotates relative to the housing, wherein the fluid passage includes a plenum disposed annularly around the shaft; and
    passing the fluid circumferentially around the shaft through the plenum.

31. The method of claim 30 wherein passing the fluid includes passing nitrogen from the housing into the axial channel.

32. The method of claim 30 wherein passing an electrical signal includes engaging the first electrical contact with a portion of the second electrical contact that intersects the shaft axis.

33. The method of claim 30 wherein passing the fluid includes drawing fluid away from the surface of the microelectronic workpiece, through the axial channel and into the fluid passage of the housing.

34. The method of claim 30, further comprising:
    positioning an anode proximate to a conductive portion of the microelectronic workpiece;
    disposing a processing fluid between anode and the microelectronic workpiece; and
    applying an electrical potential to at least one of the anode and the shaft to draw metallic ions toward the microelectronic workpiece.

35. The method of claim 30, further comprising supplying fluid to the fluid passage of the housing and directing fluid through the radial first opening into the channel, then out of the channel through the second opening and to a region adjacent to the surface of the microelectronic workpiece.

* * * * *